United States Patent
Sivakumar

(10) Patent No.: US 8,013,426 B2
(45) Date of Patent: Sep. 6, 2011

(54) TRANSISTOR HAVING RAISED SOURCE/DRAIN SELF-ALIGNED CONTACTS AND METHOD OF FORMING SAME

(75) Inventor: Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 274 days.

(21) Appl. No.: 11/965,850

(22) Filed: Dec. 28, 2007

(65) Prior Publication Data
US 2009/0166759 A1     Jul. 2, 2009

(51) Int. Cl.
*H01L 29/72* (2006.01)
(52) U.S. Cl. ........ 257/623; 257/288; 257/368; 257/401; 257/618; 257/773
(58) Field of Classification Search .................. 257/288, 257/368, 401, 618, 623, 773
See application file for complete search history.

(56) References Cited

U.S. PATENT DOCUMENTS

| | | | |
|---|---|---|---|
| 7,220,648 B2 | 5/2007 | Kim | |
| 7,498,188 B2 | 3/2009 | Fan et al. | |
| 2007/0013076 A1 | 1/2007 | Akiyama | |
| 2007/0194387 A1* | 8/2007 | Dyer et al. | 257/369 |
| 2007/0218685 A1 | 9/2007 | Sivakumar et al. | |
| 2007/0228482 A1* | 10/2007 | Wei et al. | 257/369 |
| 2009/0159934 A1* | 6/2009 | Amos et al. | 257/256 |

FOREIGN PATENT DOCUMENTS

| | | |
|---|---|---|
| WO | 2009/085520 A2 | 7/2009 |
| WO | 2009/085520 A3 | 9/2009 |

OTHER PUBLICATIONS

U.S. Appl. No. 11/821,971, filed Jun. 26, 2007.
International Search Report/ Written Opinion received for PCT Patent Application No. PCT/US2008/084947, Mailed on Jul. 15, 2009, pp. 11.
International Preliminary Report on Patentability for PCT Application No. PCT/US2008/084947, mailed Jul. 8, 2010, 7 pages.

* cited by examiner

*Primary Examiner* — Edward Wojciechowicz
(74) *Attorney, Agent, or Firm* — Winkle, PLLC

(57) ABSTRACT

A transistor structure and a method of forming same. The transistor structure includes: a semiconductor substrate having a gate-side surface; a gate disposed on the gate-side surface, the gate extending above the gate-side surface by a first height; a semiconductor extension disposed on the gate-side surface and extending above the gate-side surface by a second height larger than the first height, the semiconductor extension including a diffusion region having a diffusion surface located at the second height; and a diffusion contact element electrically coupled to the diffusion surface.

17 Claims, 4 Drawing Sheets

TRANSISTOR HAVING RAISED SOURCE/DRAIN SELF-ALIGNED CONTACTS AND METHOD OF FORMING SAME

FIELD OF THE INVENTION

Embodiments of the present invention relate generally to microelectronic layout and fabrication. In particular, embodiments relate to structures for addressing contact to gate shorting liabilities in transistors and to methods of achieving such structures.

BACKGROUND OF THE INVENTION

The ongoing scaling of transistors presents an ever expanding array of new issues to be overcome as the transistor dimensions shrink. Once such issue concerns guarding against contacts shorting to the gate structures as the transistors are scaled to ever smaller dimensions. Historically, contact-to-gate shorting has been a key obstacle to aggressive transistor dimensional scaling owing to the extreme difficulty of placing diffusion contacts between closely spaced transistor gates.

FIGS. 1a-1d represent a conventional process flow for providing contacts to the diffusion of a transistor structure. As seen in FIG. 1a, a transistor structure 100 includes a pair of gates 102 disposed next to each other on a substrate 103, spacers 104 at each side of each of the gates, and a diffusion layer 106 between the pair of gates. The diffusion layer 106 may include a source region between the two gates, and drain regions on opposite sides of the gates (not designated in the figures), or vice versa. Referring next to FIG. 1b, the prior art deposits an oxide layer 108 onto the gates and diffusion layer as shown, such as, for example, by way of chemical vapor deposition. FIG. 1c in turn shows the oxide layer 108 as having been patterned to define a contact opening 110 therein. The contact opening 110 may typically be provided using well known lithography and etching techniques. Thereafter, as shown in FIG. 1d a conductive material may be provided inside the contact opening 110 to provide a contact plug 112. The contact opening 110 may for example be filled using an electroless and/or an electrolytic plating technique. The resulting transistor structure 100 shown in FIG. 1d poses a concern with respect to a possible shorting between the contact plug 112 and each of the gates 102, as suggested by example by arrows S. The above becomes even more of a concern as a function of the generational scaling of transistor geometries.

The prior art attempts to solve the above issues by either making the contact plugs smaller, tightening alignment requirements between the contact masking layer and the gate masking layer, and/or providing larger transistors. Smaller contact plugs, however, by virtue of an increased resistance of the plug, can lead to degraded transistor performance. In addition, smaller contact openings may be difficult to fill with the conductive plug material, in this way affecting process margins. Tightening alignment requirements between the contact masking layer and the gate masking layer, on the other hand, presents limitations as well, to the extent that, since alignment is a mechanical process, and since limits of tool alignment are rapidly being approached with the scaling of transistor structures, such tightening may not be a viable option for future generation transistors. Larger transistors, on the other hand, significantly impact both transistor performance and the need for a generational scaling of transistor and chip sizes.

The prior art fails to provide a cost-effective and reliable manner of reducing the possibility of contact to gate shorting in a transistor structure.

Figure 1A:
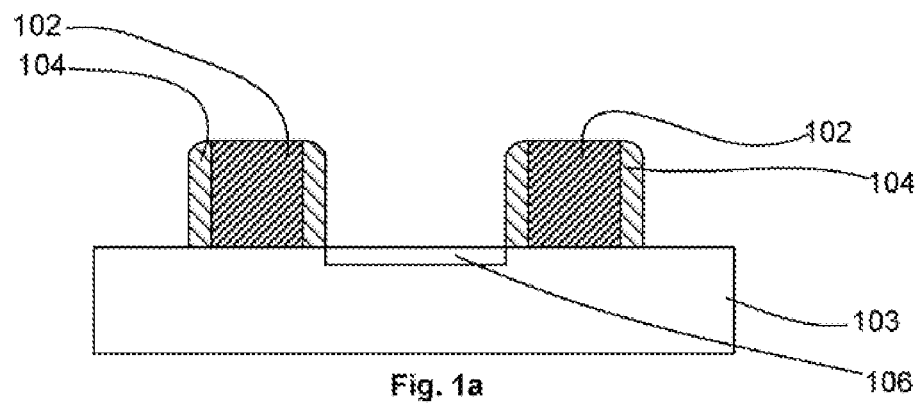
FIGS. 1a-1d are cross-sectional, schematic views of transitional transistor structures according to the prior art.
Figure 1B:
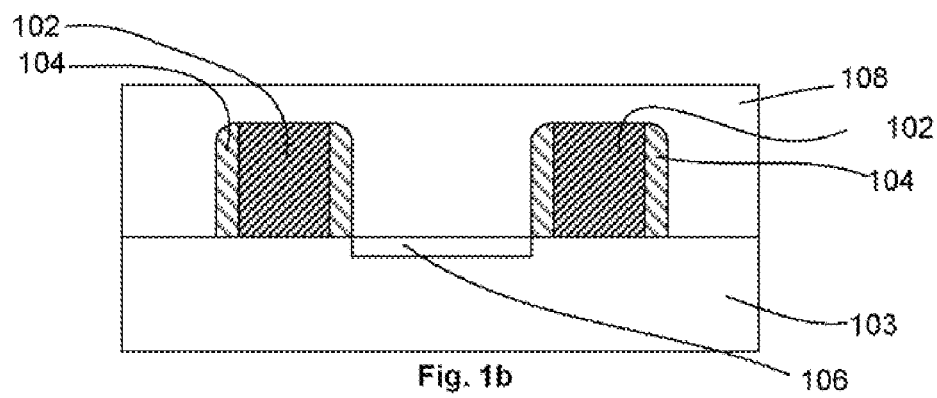
Figure 1C:
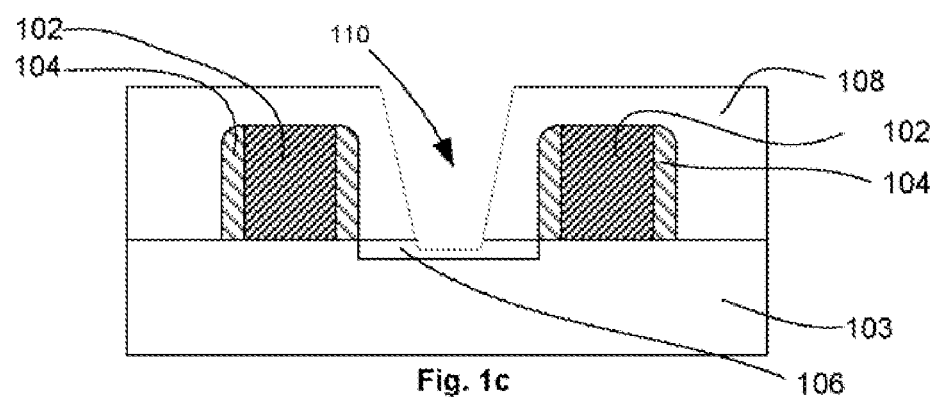
Figure 1D:
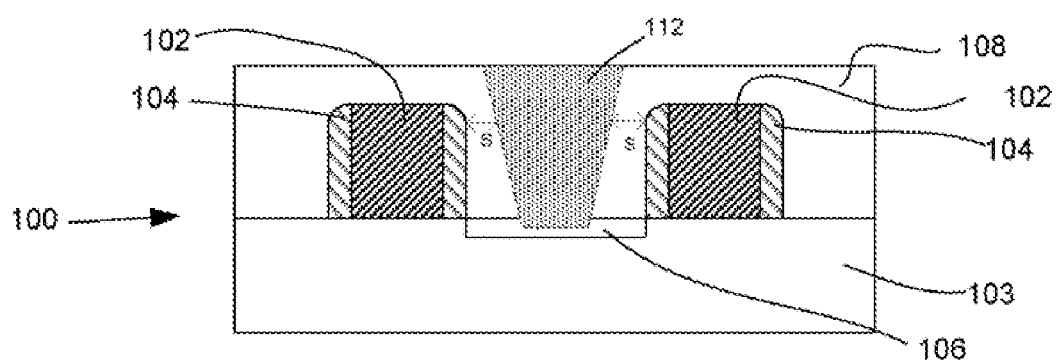

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, embodiments of a transistor structure, a method of forming the transistor structure, and a system incorporating the transistor structure are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below as used herein refer to the position of one element relative to other elements. As such, a first element disposed on, above, or below a second element may be directly in contact with the second element or it may include one or more intervening elements. However, as used herein, a first element described as being disposed adjacent a second element, including super-adjacent (adjacent and above) or supra-adjacent (adjacent and below) the second element, is in contact with the second element.

Figure 2A:
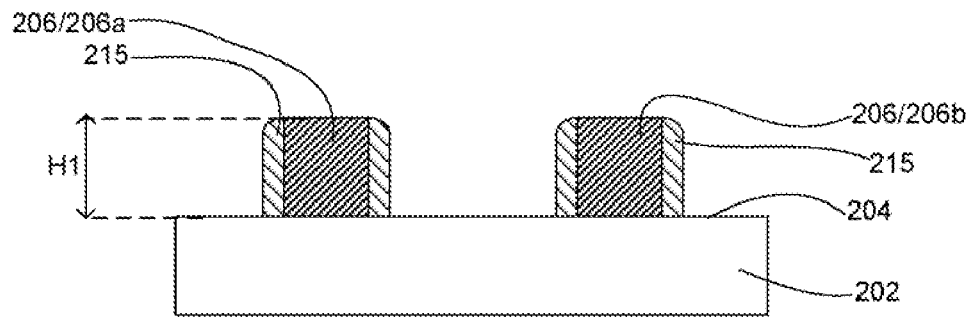
FIGS. 2a-2f are a cross-sectional, schematic views of transitional transistor structures in various stages of formation into a microelectronic device according to one embodiment.
Figure 2B:
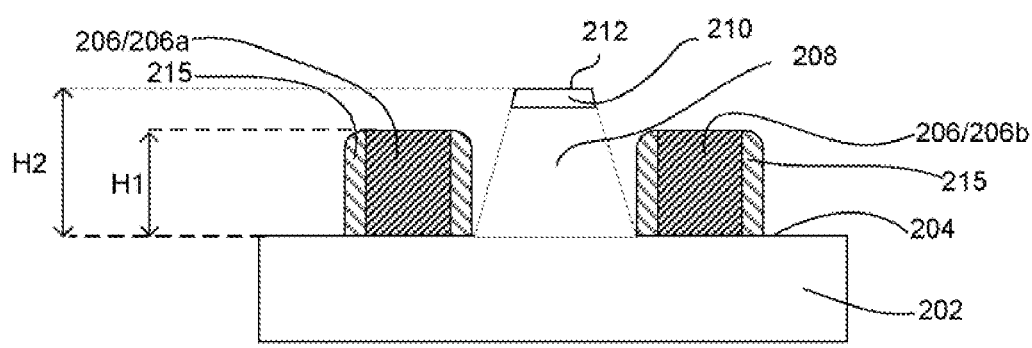
Figure 2C:
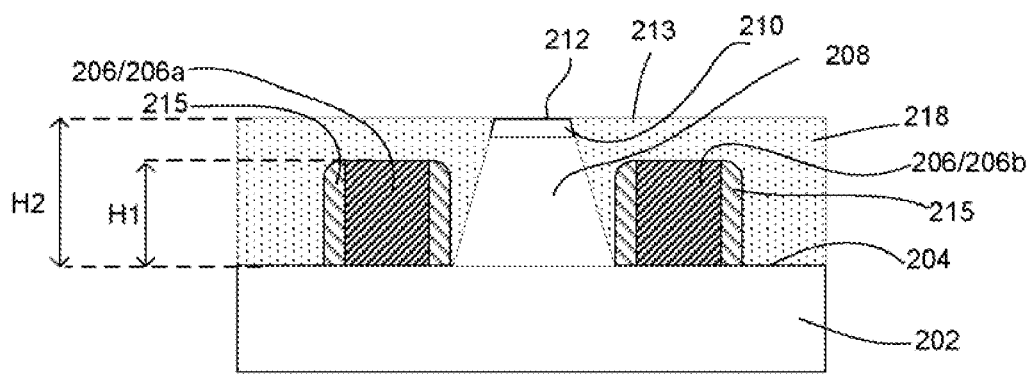
Figure 2D:
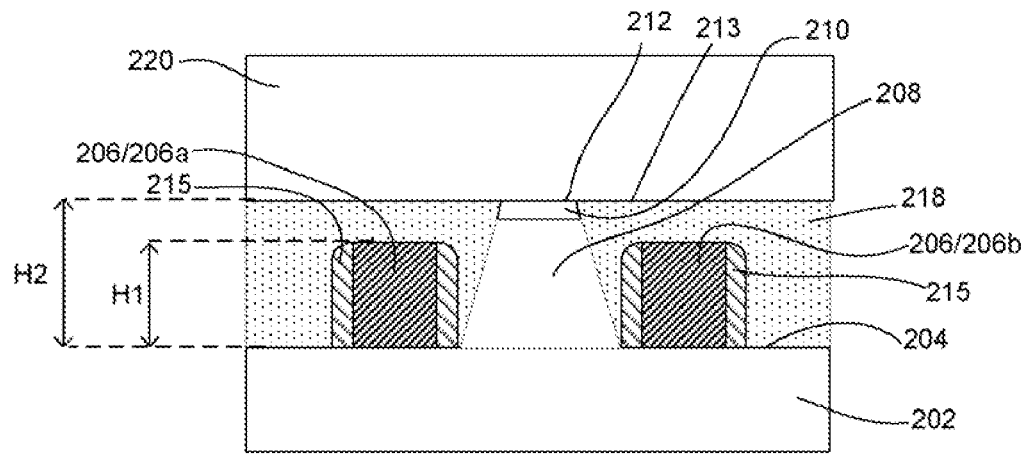
Figure 2E:
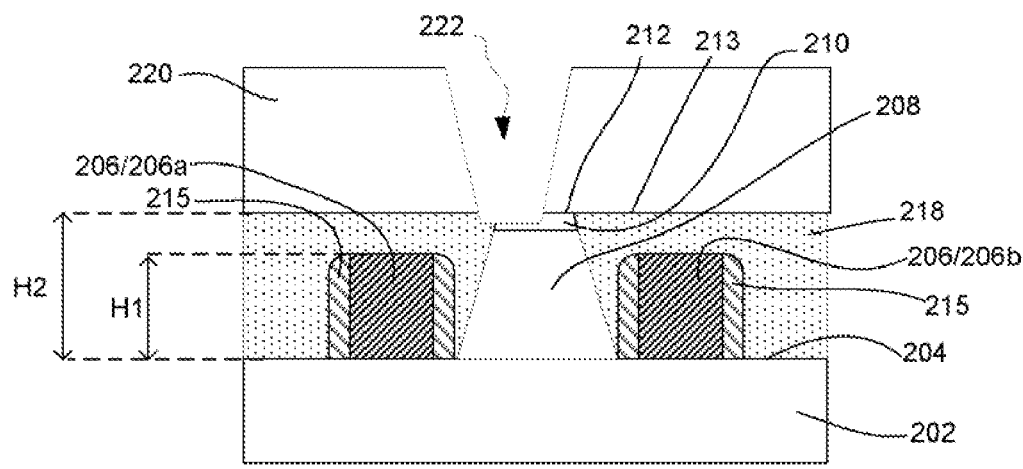
Figure 2F:
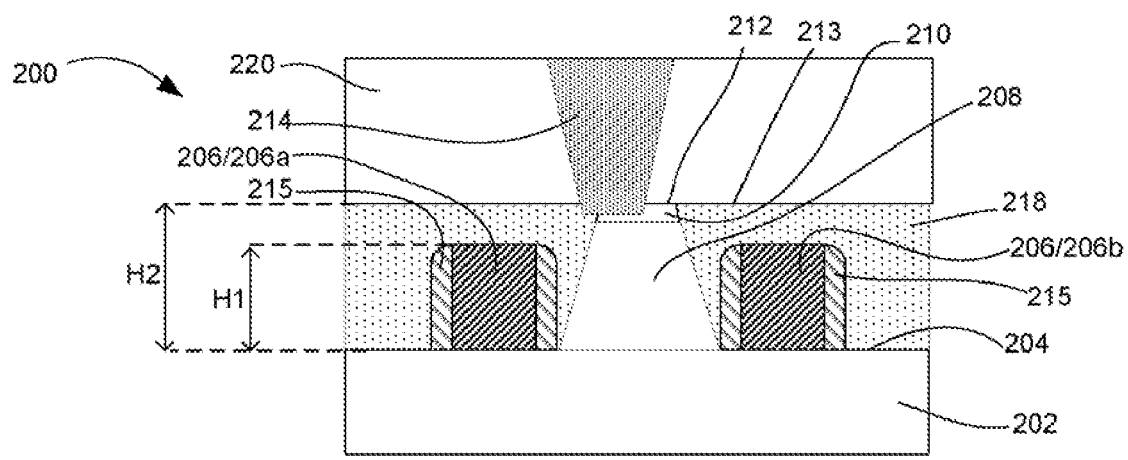

Referring to FIGS. 2a-2f, stages of forming a transistor structure as depicted in FIG. 2f are shown, where the structures are depicted in cross-section. Like reference numerals in FIGS. 2a-2f designate like components.

Referring first now to FIG. 2f, an embodiment of a transistor structure 200 comprises a semiconductor substrate 202 having a gate-side surface 204 as shown. Substrate 202 may include an insulative substrate, such as, for example, a silicon on insulator (SOI) substrate. Thus, "substrate" as used herein may refer to a substrate comprising an insulative layer, such as an oxide, on which is disposed a semiconductor layer, such as Si. In the alternative, substrate 202 may include a monocrystalline silicon substrate. Moreover, the substrate may include a non-silicon based semiconductor material, such as for example, germanium, indium antimonide, lead telluride, indium arsenide, indium phosphide, gallium arsenide, gallium antimonide, etc. The transistor structure 200 also includes a pair of adjacent gates 206 disposed on the gate-side surface 204 of substrate 202, the gates extending above the gate-side surface 204 by a first height H1. The gates may include either metal gates, or non metal gates such as gates including polysilicon. It is to be noted that the gages 206 in FIGS. 2a-2f are shown in a schematic form only. Thus, the gates may include one or more layers, such as, for example, a single gate electrode layer including a metal or a polysilicon material, or a gate including multiple layers such as a metal or a polysilicon material, and, in addition, other layers such as salicide/silicide layers, or layers having different conductivities with respect to one another. Additionally, although FIG. 2f, and associated FIGS. 2a-2e, show a transistor structure including a pair of gates, embodiments are not so limited, and include within their scope a transistor structure including one or more gates. Moreover, although FIGS. 2a-2f show a pair of gates where the gates have identical heights H1, embodiments are not so limited, and include within their scope a transistor structure including a pair of adjacent gates having different heights with respect to one another. In the latter case, the height H1 would refer to the height of the tallest gate of the pair of gates.

Conventional spacers 215 are disposed at each side of a given one of the gates 206 as shown. The transistor structure 200 additionally includes a semiconductor extension 208 which is disposed on the gate-side surface 204, and which extends above the gate-side surface of the substrate by a second height H2 which is larger than the first height H1. The semiconductor extension 208 includes a diffusion region 210 which has a diffusion surface 212 located at the second height H2. The diffusion region 210 may take any form as would be within the knowledge of a person skilled in the art. Thus, the diffusion region 210 may for example take any form as it would in the prior art, with the difference being that, according to embodiments, the diffusion region 210 is raised with respect to the gates such that the diffusion surface is at a height H2 larger than H1. In the shown embodiment, the diffusion region 210 is shown as comprising a silicide layer, although embodiments are not so limited. Thus, the diffusion region 210 may, for example, include a highly doped region, or a silicide layer, or a combination of both. The diffusion region 210 may provide a source region or a drain region between the two gates. Transistor structure 200 further includes a diffusion contact element or contact 214 electrically coupled to the diffusion surface 212. Contact 214 is a self-aligned contact or SAC to the extent that it aligns itself automatically with respect to the already provided extension 208 during its formation. As seen in FIG. 2f, transistor structure further includes an etch stop layer 218 disposed on a top surface of the gates 206, and which has a top surface 213 that is co-planar with the diffusion surface 212. The etch stop layer 218 may be made, for example, of a nitride material, and is adapted to serve as an etch stop during a patterning of the contact 214, as will be explained in detail further below with respect to FIGS. 2d and 2e. In the shown embodiment, the etch stop layer 218 is itself disposed on the gate-side surface 204, encompasses the gates 206, and extends beyond the gate-side surface 204 by a height substantially equal to the second height H2. Referring still to FIG. 2f, the pair of gates include a first gate 206a and a second gate 206b, the extension 208 is disposed between the two gates 206a and 206b, and the diffusion region 210 corresponds to one of a source region and a drain region of the transistor structure associated with each one of the gates 206a and 206b. The transistor structure 200 may further include an inter-layer dielectric layer (ILD layer) 220, such as an oxide layer, disposed on the etch stop layer 218. The contact 214 is shown as extending through the ILD layer 220 to the diffusion surface 212. It is possible as suggested for example in FIG. 2f, that a transistor structure according to embodiments may exhibit a misalignment or offset between the semiconductor extension 208 and a corresponding contact 214 by virtue of the respective extension and contact as having been provided/patterned at different times. However, provision of the etch stop layer 218 would effectively prevent shorting even in the case of a misalignment as noted above.

FIGS. 2a-2f illustrate a structure at different stages of its formation into the transistor structure 200 of FIG. 2f described above, according to a method embodiment.

Referring first to FIG. 2a by way of example, a method embodiment includes providing a structure, which includes the semiconductor substrate 202 as described above, a pair of gates 206 disposed on the gate-side surface 204 of substrate 202, the gates including spacers 215. The gates 206 and spacers 215 have already been described above in relation to FIG. 2f.

Referring next to FIG. 2b by way of example, a method embodiment further includes providing a semiconductor extension on the gate-side surface, such as extension 208 on gate-side surface 204 of substrate 202. As seen in FIG. 2b, and as explained with respect to FIG. 2f above, the extension 208 extends above the gate-side surface 204 by the second height H2, and includes the diffusion region 210 having the diffusion surface 212. According to one embodiment, the extension 208 may be provided by epitaxially growing the extension onto the gate-side surface 204 in a weal known manner. The extension 208 may automatically assume a tapered profile, as shown in the cross-sectional view of FIGS. 2b-2, during its formation by way of epitaxial growth, mainly as a result of an orientation of the crystal planes during epitaxial formation, as would be recognized by one skilled in the art. A tapered profile would be preferable in any event in order to increase a distance between the diffusion surface 214 and each of the gates 206. Embodiments are not so limited, however, and include within their scope the provision of an extension of any shape, such as one having parallel side-walls, according to application needs. After formation of the extension 208, a diffusion region 210 may be provided onto the extension according to any one of well known techniques for providing a diffusion region.

Referring next to FIG. 2c by way of example, a method embodiment further comprises providing an etch stop dielectric layer 218 which is disposed on a top surface of the gates 206, and which has a top surface 213 that is co-planar with the diffusion surface 212. As noted above, the etch stop layer may include a nitride material, or, in the alternative, a carbide material, and may for example be provided using chemical vapor deposition, or using any other ones of well known techniques for providing a dielectric layer, as would be within the knowledge of a skilled person. The etch stop layer is disposed to protect the gates during a contact opening etch process as described further below in relation to FIGS. 2d and 2e. Preferably, the etch stop layer 218 may be disposed on the gate-side surface 204 as shown, and to encompass the gates. The etch stop layer 218 "encompasses," the gates as used herein in the sense that is includes the gates in the extent of its volume, as suggested for example in FIGS. 2c-2f, although embodiments are not so limited. According to an embodiment, after provision of an etch stop material onto the top surfaces of gates 206, such as by way of chemical vapor deposition, the etch stop material may be planarized, such as through polishing, such that a top surface of the etch stop layer 218 is co-planar with the diffusion surface 212.

Referring next to FIG. 2d by way of example, a method embodiment includes providing an ILD layer 220 onto the etch stop layer 218. Provision of the ILD layer 220 may be by way of chemical vapor deposition, for example, or through any other method as would be within the knowledge of a skilled person. The ILD material of the ILD layer may be deposited by way of chemical vapor deposition, and then polished back, for example, in a well known manner, to achieve the structure shown in FIG. 2d, the ILD layer may include, for example, an oxide material, or any other material that would serve as an ILD as would be within the knowledge of a skilled person. A thickness of the ILD layer may be chosen as a function of yield considerations with respect to a subsequent formation of the contact 214 therein as will be described in further detail regarding FIG. 2e, and further as a function of electrical considerations regarding the contact 214, as would be within the knowledge of the skilled person.

Referring next to FIG. 2e by way of example, a method embodiment includes patterning the ILD layer 220 to create a contact opening 222 therein, the opening 222 extending through the ILD layer 220 to the diffusion surface 212. Patterning of the ILD layer 220 to provide the opening 222 may, for example, be achieved by using well known lithography and etching techniques, as would be within the knowledge of one skilled in the art. Since the diffusion region 210 is raised by virtue of the extension 208 above the height H1 of the gates, the etch stop layer 218 below the diffusion surface 212 will prevent shorting to the gates 206. It is noted that an etch stop layer having an adequate selectivity to the ILD etch performed to provide the contact opening may be chosen.

Referring next to FIG. 2f by way of example, a method embodiment includes filling the contact opening 222 with a conductive material, such as a metal, for example, to provide the diffusion contact element or contact 214. Contact 214 may be provided using any one of well known techniques to fill a contact opening, such as, for example, by using electroless and/or electrolytic plating. As noted previously, the contact 214 may exhibit a misalignment or offset with the semiconductor extension 208 by virtue of the respective extension and contact as having been provided/patterned at different times. Even in such a case, however, the presence of the extension at a height H2 which is larger than height H1, coupled with the presence of the etch stop layer 218, prevent a shorting between the contact 214 and the gates 206.

Advantageously, embodiments provide a transistor structure where the diffusion surface is raised above the height of the gate. Embodiments therefore address the disadvantage of prior art transistor structures where the diffusion contact penetrated the gap between two tightly spaced gates, leaving the transistor structure vulnerable to contact-to-gate shorting. Embodiments further advantageously provide an etch stop layer to protect the top of the gate so that a contact that may misalign with respect to the diffusion surface to a considerable extend would still not cause any shorting to the gate. Additionally, advantageously, method embodiments may rely on well known process flow techniques, and are thus simple and cost-effective to implement, as they would not require tool changes or extensive tool adjustments.

Figure 3:
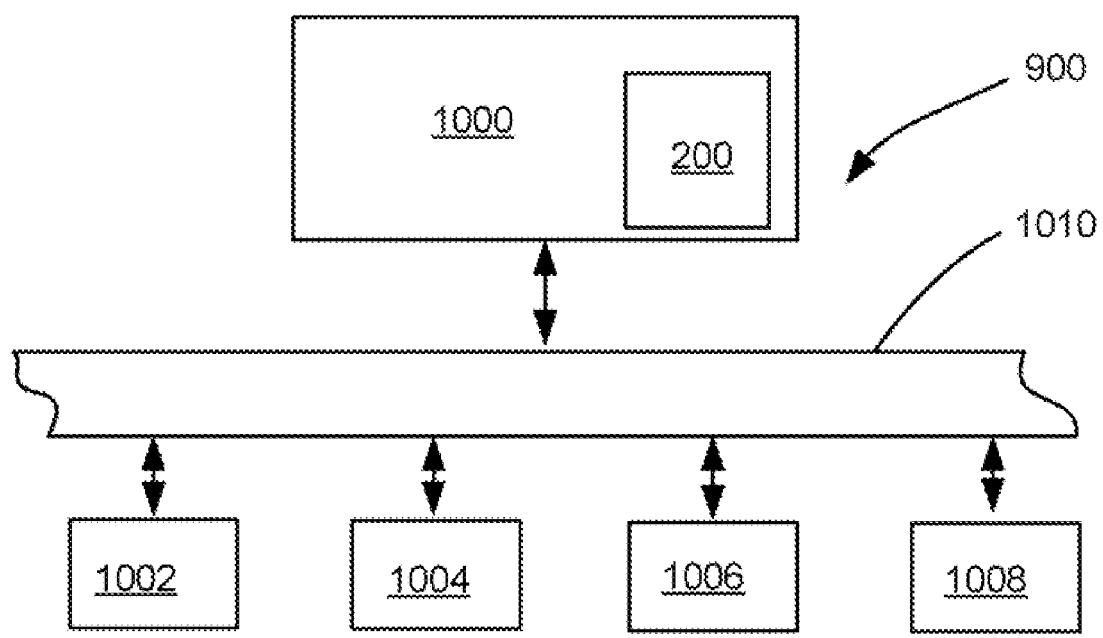
FIG. 3 is a schematic view of a system embodiment incorporating a microelectronic device formed according embodiments.

Referring to FIG. 3, there is illustrated one of many possible systems 900 in which embodiments of the present invention may be used. In one embodiment, the electronic assembly 1000 may include a transistor structure, such as transistor structure 200 of FIG. 2f. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 3, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Thus, for example, while embodiments disclosed herein teach the formation of protective caps using sacrificial caps, other methods of providing the protective caps are also within the scope of embodiments.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A transistor structure comprising:
    a semiconductor substrate having a gate-side surface;
    a gate disposed on the gate-side surface, the gate extending above the gate-side surface by a first height;
    a spacer adjacent to a sidewall of the gate;
    a semiconductor extension disposed on the gate-side surface and extending above the gate-side surface by a second height larger than the first height, the semiconductor extension including a diffusion region having a diffusion surface located at the second height;
    a contact element electrically coupled to the diffusion surface; and
    planarized etch stop layer having a top surface co-planar with the diffusion surface and disposed directly adjacent to the semiconductor extension, the diffusion region, the spacer, a top surface of the gate and the gate-side surface to form a planarized etch stop layer above the spacer, the top surface of the gate and the gate-side surface, wherein the contact element is disposed on and in direct contact with the diffusion surface and wherein the etch stop layer is positioned between the contact element and the top surface of the gate.

2. The transistor structure of claim 1, wherein the semiconductor extension has a tapered profile to increase a distance between the diffusion surface and the gate.

3. The transistor structure of claim 1, wherein the spacer and the etch stop layer are positioned between the semiconductor extension and the gate.

4. The transistor structure of claim 3, wherein the etch stop layer extends beyond the gate-side surface by a height substantially equal to the second height.

5. The transistor structure of claim 1, wherein the contact element is a self-aligned contact.

6. The transistor structure of claim 1, wherein the diffusion region is positioned above the top surface of the gate.

7. The transistor structure of claim 1, wherein the semiconductor extension is disposed adjacent the gate, and wherein the diffusion region corresponds to one of a source region and a drain region of the transistor structure.

8. The transistor structure of claim 7, wherein:
    the gate is a first gate;

the transistor structure includes a second gate disposed on the gate-side surface of the substrate;

the semiconductor extension is disposed between the first gate and the second gate; and the diffusion region corresponds to one of a source region and a drain region associated with both the first gate and the second gate.

9. The transistor structure of claim 3, further comprising an ILD layer disposed on the etch stop layer, wherein the contact element extends through the ILD layer to the diffusion surface.

10. A system including:
an electronic assembly including:
a transistor structure comprising:
a semiconductor substrate having a gate-side surface;
a gate disposed on the gate-side surface, the gate extending above the gate-side surface by a first height;
a semiconductor extension disposed on the gate-side surface and extending above the gate-side surface by a second height larger than the first height, the semiconductor extension including a diffusion region having a diffusion surface located at the second height;
a contact element electrically coupled to the diffusion surface;
a planarized etch stop layer having a top surface co-planar with the diffusion surface and disposed directly adjacent to the semiconductor extension, the diffusion region, the spacer, a top surface of the gate and the gate-side surface to form a planarized etch stop layer above the spacer, the top surface of the gate and the gate-side surface, wherein the contact element is disposed on and in direct contact with the diffusion surface and wherein the etch stop layer is positioned between the contact element and the top surface of the gate; and a main memory coupled to the electronic assembly.

11. The system of claim 9, wherein the contact element is a self-aligned contact.

12. The system of claim 11, wherein the etch stop layer extends beyond the gate-side surface by a height substantially equal to the second height.

13. The system of claim 12, wherein the semiconductor extension has a tapered profile to increase a distance between the diffusion surface and the gate.

14. The system of claim 9, wherein the diffusion region of the semiconductor extension is positioned above the top surface of the gate.

15. The system of claim 10, wherein the semiconductor extension is disposed adjacent the gate, and wherein the diffusion region corresponds to one of a source region and a drain region of the transistor structure.

16. The system of claim 15, wherein:
the gate is a first gate;
the transistor structure includes a second gate disposed on the gate-side surface of the substrate;
the semiconductor extension is disposed between the first gate and the second gate; and
the diffusion region corresponds to one of a source region and a drain region associated with both the first gate and the second gate.

17. The system of claim 11, further comprising an ILD layer disposed on the etch stop layer, wherein the contact element extends through the ILD layer to the diffusion surface.

* * * * *